United States Patent
Sterzbach

(10) Patent No.: US 10,983,144 B2
(45) Date of Patent: Apr. 20, 2021

(54) MEASUREMENT APPARATUS WITH PROJECTED USER INTERFACE

(71) Applicant: Rohde & Schwarz GmbH & Co. KG, Munich (DE)

(72) Inventor: Bernhard Sterzbach, Munich (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 217 days.

(21) Appl. No.: 15/946,673

(22) Filed: Apr. 5, 2018

(65) Prior Publication Data
US 2019/0107554 A1 Apr. 11, 2019

(30) Foreign Application Priority Data

Oct. 11, 2017 (DE) .......................... 102017218092.7

(51) Int. Cl.
| | |
|---|---|
| *G01R 1/02* | (2006.01) |
| *G01R 1/18* | (2006.01) |
| *G01R 31/319* | (2006.01) |
| *G01R 31/28* | (2006.01) |
| *G06F 3/0484* | (2013.01) |

(52) U.S. Cl.
CPC ............... *G01R 1/025* (2013.01); *G01R 1/18* (2013.01); *G01R 31/31912* (2013.01); *G01R 31/2806* (2013.01); *G06F 3/04847* (2013.01)

(58) Field of Classification Search
CPC .... G01R 1/025; G01R 1/18; G01R 31/31912; G01R 31/2806; G06F 3/04847
See application file for complete search history.

(56) References Cited

U.S. PATENT DOCUMENTS

| | | | |
|---|---|---|---|
| 9,152,277 B1* | 10/2015 | Beguin | G06F 3/044 |
| 2008/0111793 A1* | 5/2008 | Peters | G06F 3/0425 |
| | | | 345/173 |
| 2008/0211779 A1* | 9/2008 | Pryor | G01C 21/3664 |
| | | | 345/173 |
| 2014/0237292 A1* | 8/2014 | Chan | G06F 11/2733 |
| | | | 714/32 |
| 2017/0063474 A1* | 3/2017 | Humphrey | G06F 16/22 |
| 2019/0099681 A1* | 4/2019 | Rico | B25J 15/04 |

FOREIGN PATENT DOCUMENTS

| | | |
|---|---|---|
| EP | 0554492 A1 | 8/1993 |
| WO | 2013009482 A2 | 1/2013 |

OTHER PUBLICATIONS

Friedman, "Microsoft Surface Technology," Seminar: Advances in Human Computer Interaction, Saarland University, Jun. 12, 2007, 38 pp.

* cited by examiner

*Primary Examiner* — Roland J Casillas
(74) *Attorney, Agent, or Firm* — Shumaker & Sieffert, P.A.

(57) ABSTRACT

A measurement apparatus (1) comprising at least one shielded electronic measurement circuit (2) configured to measure and process electrical signals and a user interface (6) used by a user to interact with the electronic measurement circuits (2) of said measurement apparatus (1), wherein the user interface (6) comprises at least one adaptable graphical user interface (6A) projected by a projection unit (7) of said measurement apparatus on one or several projection areas.

12 Claims, 7 Drawing Sheets

MEASUREMENT APPARATUS WITH PROJECTED USER INTERFACE

FIELD OF THE INVENTION

The invention relates to a measurement apparatus with a projected user interface and in particular to a high-frequency measurement apparatus comprising an adaptable graphical user interface projected by a projection unit.

TECHNICAL BACKGROUND

There exists a wide variety of different measurement apparatuses used for measuring measurement objects including electronic components, electronic circuits or devices under test, DUT, having a plurality of electronic components. A measurement apparatus can be used for instance to measure technical characteristics of mobile phones or smartphones and can be used to test and/or measure several devices under test, DUT, in parallel. A measurement apparatus can comprise one or more electronic measurement circuits configured to measure and/or process electrical signals. These electronic measurement circuits can also comprise means for generating test signals applied to devices under test, DUT, such as mobile phones. An electronic measurement circuit can comprise interfaces to connect ports of the device under test, DUT, via cables to the respective measurement circuit. Conventional measurement apparatuses comprise a user interface having a display and control components such as knobs or buttons to interact with the measurement apparatus. The display and control components are assembled to form an operating panel of the measurement apparatus. In a conventional measurement apparatus, the arrangement of the control components and/or display units is fixed.

Accordingly, a user interface in a conventional measurement apparatus cannot be arranged flexibly for different measurement objects of interest. For instance, the user interface of a conventional measurement apparatus cannot be configured for different device variants of different measurement object variants, for instance different variants of smartphones to be measured by the measurement apparatus.

A drawback of a conventional measurement apparatus is that if a component of the operating panel of the user interface such as a touchscreen display cannot be procured anymore a redesign of the complete operation panel becomes necessary.

A further disadvantage of a conventional measurement apparatus resides in the fact that the measurement apparatus may be used for a huge variety of different measurement objects but its user interface is fixed and cannot be adjusted to the different needs for performing the different measurement procedures and/or performing measurement procedures for different kinds or variants of measurement objects.

Further, the size of the measurement apparatus is relevant. In particular, at mobile phone production sites, different measurement devices or measurement apparatuses have to be stacked and need to be very compact and small. Moreover, some measurement applications or procedures at very high frequencies do not allow for long measurement cables and thus measurement apparatuses have to be small so that they can be placed more closely to a device under test, DUT.

A further drawback of conventional measurement apparatuses is that conventional user interfaces using display units may be problematic for RF shielding of the electronic measurement circuits located within the housing of the measurement apparatus. Moreover, display units are expensive and are not always needed for certain measurement procedures. Further, for measurement apparatuses used for low production volumes expenses for a design or a display unit of the operating panel of the user interface are comparatively high. A conventional user interface of a measurement apparatus having an integrated display unit cannot be flexibly adapted to specific measurement tasks.

SUMMARY OF THE INVENTION

Accordingly, it there is need to provide a measurement apparatus for overcoming the above-mentioned drawbacks providing a flexible user interface for a huge variety of different measurement objects and/or measurement procedures and wherein the user interface requires a minimum space.

This object is achieved according to a first aspect of the present invention by a measurement apparatus comprising the features of claim 1.

The invention provides according to the first aspect a measurement apparatus comprising at least one shielded electronic measurement circuit configured to measure and process electrical signals and a user interface used by a user to interact with the electronic measurement circuits of said measurement apparatus, wherein said user interface comprises at least one adaptable graphical user interface projected by a projection unit of said measurement apparatus on one or several projection areas.

In a possible embodiment of the measurement apparatus according to the first aspect of the present invention, the adaptable graphical user interface is projected by said projection unit as a frontal projection on one or several projection areas including projection panels and/or housing plates of the measurement apparatus.

In a further possible embodiment of the measurement apparatus according to the first aspect of the present invention, the adaptable graphical user interface is projected by said projection unit as a frontal projection on surfaces of one or several measurement objects located in the vicinity of said measurement apparatus.

In a still further possible embodiment of the measurement apparatus according to the first aspect of the present invention, the adaptable graphical user interface is projected by the projection unit as a frontal projection on surfaces of the measurement surrounding.

In a further possible embodiment of the measurement apparatus according to the first aspect of the present invention, the measurement objects comprise electronic components located on an external circuit board, workpieces and/or devices under test measured by the electronic measurement circuits of the measurement apparatus.

In a still further possible embodiment of the measurement apparatus according to the first aspect of the present invention, the adaptable graphical user interface is projected by said projection unit of said measurement apparatus as a rear projection on one or more projection areas including rear projection screens of said measurement apparatus and/or rear projections screens of measurement objects located in the vicinity of said measurement apparatus.

In a still further possible embodiment of the measurement apparatus according to the first aspect of the present invention, the measurement apparatus further comprises at least one user interaction detection unit adapted to detect an interaction of the user with the projected graphical user interface and/or adapted to detect a change of the projection area caused by the user or caused by an external physical object.

In a possible embodiment of the measurement apparatus according to the first aspect of the present invention, the projection unit of said measurement apparatus comprises at least one laser projector.

In a further possible embodiment of the measurement apparatus according to the first aspect of the present invention, the user interface of said measurement apparatus further comprises a physical user interface with mechanical control elements manually operated by a user to configure and/or to adjust the projected graphical user interface.

In a further possible embodiment of the measurement apparatus according to the first aspect of the present invention, the adaptable graphical user interface projected by the projection unit is changed automatically by a controller of said measurement apparatus depending on a current internal operation state of said measurement apparatus.

In a still further possible embodiment of the measurement apparatus according to the first aspect of the present invention, the adaptable graphical user interface is changed automatically by a controller of said measurement apparatus depending on an operation state and/or output signals of at least one measurement object measured by an electronic measurement circuit of said measurement apparatus.

In a still further possible embodiment of the measurement apparatus according to the first aspect of the present invention, one or more mechanical control elements are attached temporarily to a rear projection screen of the measurement apparatus by magnets, suction cups and/or removable glue.

In a further possible embodiment of the measurement apparatus according to the first aspect of the present invention, the attached mechanical control elements attached to the rear projection screen comprise reflection means adapted to change a reflection of light projected on said rear projection screen by said projection unit upon actuation of the respective mechanical control element by a user wherein the reflected change is detected by a sensor unit of said measurement apparatus.

In a further possible embodiment of the measurement apparatus according to the first aspect of the present invention, different rear projection screens used as projection areas for the graphical user interface of said measurement apparatus are preconfigured and are exchangeable by a user for different measurement purposes.

In a still further possible embodiment of the measurement apparatus according to the first aspect of the present invention, the preconfigured rear projection screen comprises at least one screen marker used to detect a type and/or a configuration of the rear projection screen mounted by a user to the measurement apparatus by a screen detection unit of said measurement apparatus.

Where appropriate, the above-mentioned configurations and developments can be combined in any manner. Further possible configurations, developments and implementations of the invention also include combinations, which are not explicitly mentioned, of features of the invention which have been described previously or are described in the following with reference to the embodiments. In particular, in this case, a person skilled in the art will also add individual aspects as improvements or supplements to the basic form of the present invention.

CONTENT OF THE DRAWINGS

In the following, possible embodiments of the measurement apparatus are described in more detail with reference to the enclosed figures.

Figure 1:
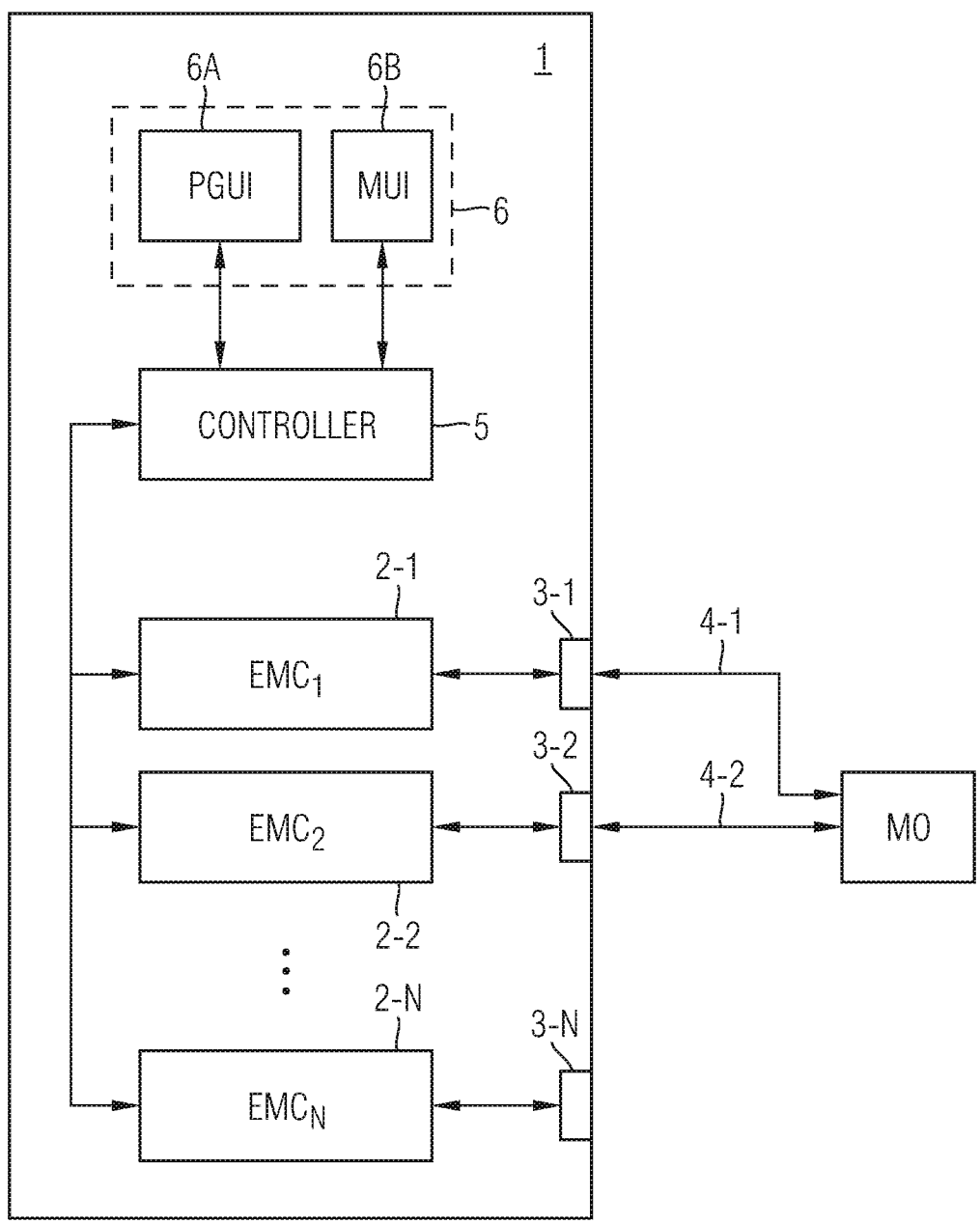
FIG. 1 shows a block diagram for illustrating a possible exemplary embodiment of a measurement apparatus according to the present invention.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated otherwise.

DESCRIPTION OF EMBODIMENTS

As can be seen in the block diagram of FIG. 1, a measurement apparatus 1 according to the present invention can comprise in the illustrated embodiment shielded electronic measurement circuits 2-1, 2-2, 2-n configured to measure and process electrical signals. The measurement apparatus 1 comprises a housing adapted to provide RF shielding of the electronic measurement circuits. The electronic measurement circuits 2-i can be adapted to generate, measure and process electrical signals, in particular high-frequency signals, e.g. with a frequency of more than 1 GHz. Each electronic measurement circuit 2-i can comprise a measurement interface 3-i to connect one or several measurement objects MO via measurement cables 4-i as illustrated in FIG. 1. The measurement apparatus 1 can comprise several electronic measurement circuits 2-i which allow to measure one or more measurement objects simultaneously in parallel. The measurement object MO can be any kind of electronic device, in particular a device under test DUT or a printed circuit board PCB. The measurement object MO can also be a component of an electronic device or a workpiece processed under the direction of the measurement apparatus 1. Ports of the measurement object MO can be connected via electronic cables 4-i and measurement interfaces to one or several internal electronic measurement circuits 2-i of the measurement apparatus 1 as shown in FIG. 1. The electronic measurement circuits 2-i can be controlled by a controller 5 of the measurement apparatus 1. The controller 5 can be connected to a user interface 6 of the measurement apparatus 1. In a possible embodiment, the user interface 6 comprises an adaptable graphical user interface 6A. The graphical user interface 6A can be projected by a projection unit of the measurement apparatus 1 on one or several projection areas. Besides the adaptable graphical user interface 6A, the user interface 6 of the measurement apparatus 1 can comprise in a possible embodiment also a physical or mechanical user interface with mechanical control elements 6B or a touchscreen which can be manually operated by a user. The mechanical or physical user interface 6B can be used by the user to configure and/or to adjust the projected graphical user interface 6A. In a possible embodiment, the measurement apparatus 1 comprises a user interface 6 including only the projected graphical user interface 6A. The user of the measurement apparatus 1 can interact with the internal operation of the different electronic measurement circuits 2-$i$ of the measurement apparatus 1 via the user interface 6, in particular by means of the projected graphical user interface 6A.

In a possible embodiment, the adaptable graphical user interface 6A can be projected by a projection unit as a frontal projection on one or several projection areas. These projection areas can include projection panels or housing plates of the housing of the measurement apparatus 1. In a further possible embodiment, the adaptable graphical user interface 6A is projected by a projection unit of the measurement apparatus 1 on surfaces of one or several measurement objects located in the vicinity of the measurement apparatus, for instance the measurement object MO illustrated in FIG. 1. In a still further possible embodiment, the adaptable graphical user interface 6A is projected by a projection unit of the measurement apparatus 1 as a frontal projection on surfaces of the measurement surrounding, for instance a working bench or table where the measurement object MO has been placed by the user.

In an alternative embodiment, the adaptable graphical user interface 6A can also be projected by a projection unit of the measurement apparatus 1 as a rear projection on one or more projection areas including rear projection screens of the measurement apparatus 1 and/or on rear projection screens of one or several measurement objects MO located in the vicinity of the measurement apparatus 1.

In a possible embodiment of the measurement apparatus 1, the measurement apparatus 1 can further comprise a user interaction detection unit UIDU which is adapted to detect an interaction of the user U with the projected graphical user interface 6A. For instance, a finger of a hand of the user touching an element of the projected graphical user interface 6A can cast a shadow in an image taken by an image sensor or camera of the measurement apparatus 1. Other sensors can also be used for detecting a user interaction with the projected graphical user interface 6A. In a further possible embodiment, the user interaction detection unit can also detect the change of the projection area caused by the user. For example, a user may choose to pull out an adjustable projection screen only halfway to save space. The projected graphical user interface 6A can then be reduced to the most important elements responsive to the user interaction. A change of the projection area can also be caused by an external physical object. In a further possible embodiment, a change of the projection areas can be detected optically. The projected content is then adjusted accordingly to fit the detected size of the projection area. The adaptable graphical user interface 6A is projected by the projection unit of the measurement apparatus 1 which can be attached in a possible embodiment to the housing of the measurement apparatus 1. In a possible embodiment, the projection unit can comprise at least one laser projector. The projection unit can also be integrated in the measurement apparatus 1 and project the graphical user interface 6A on a diffusing screen.

In a possible embodiment, the adaptable graphical user interface 6A projected by the attached or integrated projection unit is changed automatically by the controller 5 of the measurement apparatus 1 depending on an internal current operation state of the measurement apparatus 1. Further, the adaptable graphical user interface 6A can be changed or adapted automatically by the controller 5 of the measurement apparatus 1 in response to a monitored operation state of the measurement object MO measured by at least one electronic measurement circuit 2-$i$ of the measurement apparatus 1. In a possible embodiment, output signals of the measurement objects are supplied via one or several cables and measurement interfaces to an electronic measurement circuit 2-$i$ of the measurement apparatus 1 which derive from the applied signals a current operation state of the measurement object MO such as a device under test DUT and notifies the controller 5 of the measurement apparatus 1 about the current operation state of the measurement object MO. In response to the observed operation state of the device under test DUT or measurement object MO, the controller 5 can then reconfigure or change the projected graphical user interface 6A to provide the possibility to perform a user interaction fitting to the current operation state of the measurement object MO. In a possible embodiment, the projected graphical user interface 6A can display information data indicating a current operation state of the measurement object MO and/or the current internal operation state of the measurement apparatus 1.

As can be seen from the embodiment of FIG. 1, the graphical user interface 6A of an electrical device can be projected onto a surface, either as a frontal projection on a flat or curved surface or as a rear projection on a diffusing rear projection screen. The projected image can be designed with a high degree of flexibility. The user interaction can be enabled via an image sensor which is adapted to detect changes in the projected image of the graphical user interface 6A caused by user actions. The size of the graphical user interface area can be changed or the graphical user interface 6A can be even removed completely depending on the current needs of the user. The graphical user interface 6A can be enhanced by physical controls. For instance, when projecting on a horizontal work surface, a graphical user interface 6A can be projected on the workpiece or a measurement object MO within a projection area, e.g. to indicate a component on a circuit board. The projected graphical user interface 6A of the measurement apparatus 1 can be adapted to suit user preferences and can fit the current use case or measurement procedure. The projections of the projected graphical user interface 6A can include labels and indications for connectors within the projection area. These indications can reflect a current operating state of the measurement apparatus 1 and/or the measurement object MO. The user can interact with the projected graphical user interface 6A by touching the surface and the touching can be detected by an optical sensor. It is further possible to attach physical control elements to the projection surface of the projected graphical user interface 6A. These control elements can be read out using an optical sensor. Consequently, no electrical connection is required. The placement of the control elements is flexible. The control elements can comprise mechanical control elements such as buttons or knobs. In a possible embodiment, the control elements can be mounted temporarily on the rear projection screen of the projected graphical user interface 6A. In a possible embodiment, the mechanical control elements such as buttons or knobs can be attached temporarily to a rear projection screen by magnets, suction cups and/or removable glue. In a possible embodiment, the attached mechanical control elements attached to a rear projection screen can comprise reflection means adapted to change a reflection of light projected on said rear projection screen by the projection unit. This change of reflection can be formed in response to an actuation of the mechanical control element by a user. The change of reflection can then be detected by a sensor element of the measurement apparatus 1.

In a further possible embodiment, different rear projection screens used as projection areas for the graphical user interface 6A of the measurement apparatus 1 can be preconfigured and can be exchanged by a user for different measurement purposes or different kinds of measurement arrangements. It is possible that multiple rear projection screens are prepared with different kinds of physical control elements for different measurement arrangements and/or different measurement tasks. A user can choose the fitting rear projection screen which is most suitable for the current test procedure and can be mounted to the measurement apparatus 1. In a possible implementation, the preconfigured rear projection screen can comprise at least one screen marker which is used to detect a type and/or a configuration of the prepared rear projection screen mounted by a user to the measurement apparatus 1 by a separate screen detection unit of the measurement apparatus 1.

Figure 2:
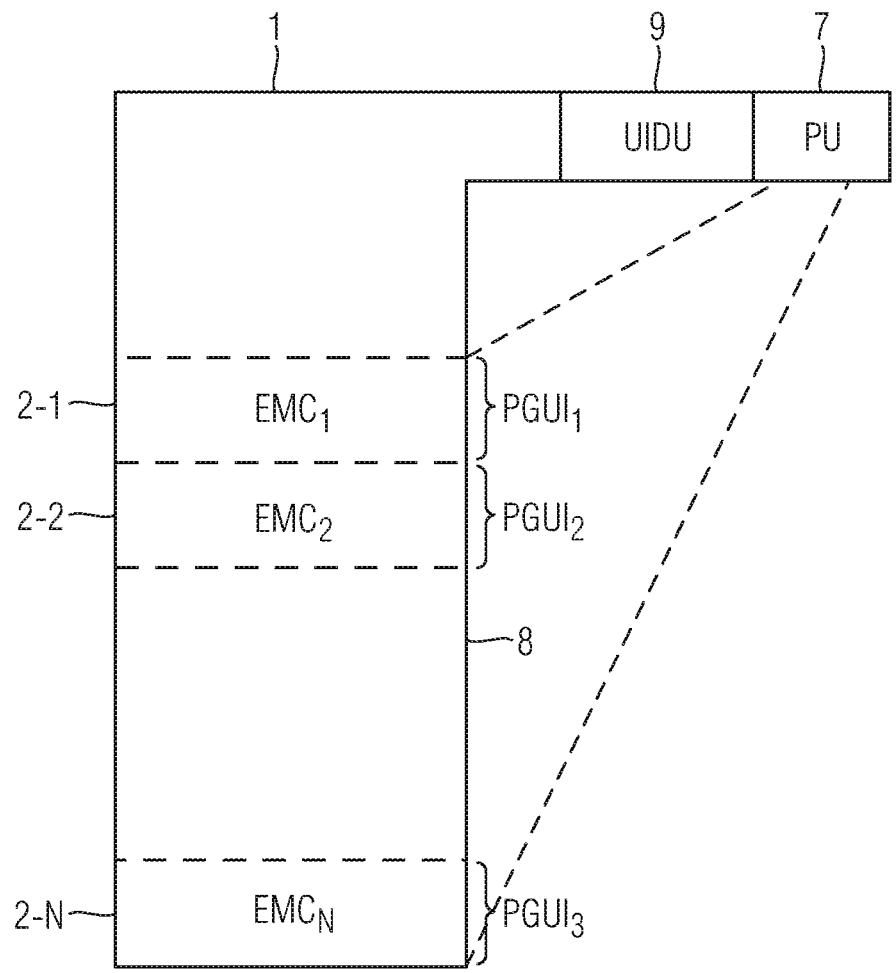
FIG. 2 shows schematically a possible exemplary embodiment of a measurement apparatus according to the present invention.

FIG. 2 shows schematically a possible exemplary embodiment of a measurement apparatus 1 according to the present invention. In the illustrated embodiment, the measurement apparatus 1 comprises several electronic measurement circuits 2-1 to 2-$n$ and a projection unit 7 configured to project one or several adaptable graphical user interfaces 6A on a front plate 8 of the housing of the measurement apparatus 1. In the illustrated exemplary embodiment, a separate matching projected graphical user interface 6A is projected on the front plate 8 for each electronic measurement circuit 2-$i$ within the measurement apparatus 1. In a possible embodiment, the measurement apparatus 1 can for instance comprise a measurement apparatus having a mounting rack for mounting different electronic measurement circuits integrated on corresponding circuit boards. Each mounted circuit board within the mounting rack can comprise an individual front plate 8 which can be used as a projection area for a corresponding projected graphical user interface 6A projected by the projection unit 7 onto the corresponding section of the front plate 8. In the illustrated embodiment of FIG. 2, the measurement apparatus 1 comprises a user interaction detection unit 9 adapted to detect an interaction of a user with one or several of the projected graphical user interfaces 6A projected on the front plate 8 of the housing of the measurement apparatus 1 as shown in FIG. 2.

Figure 3:
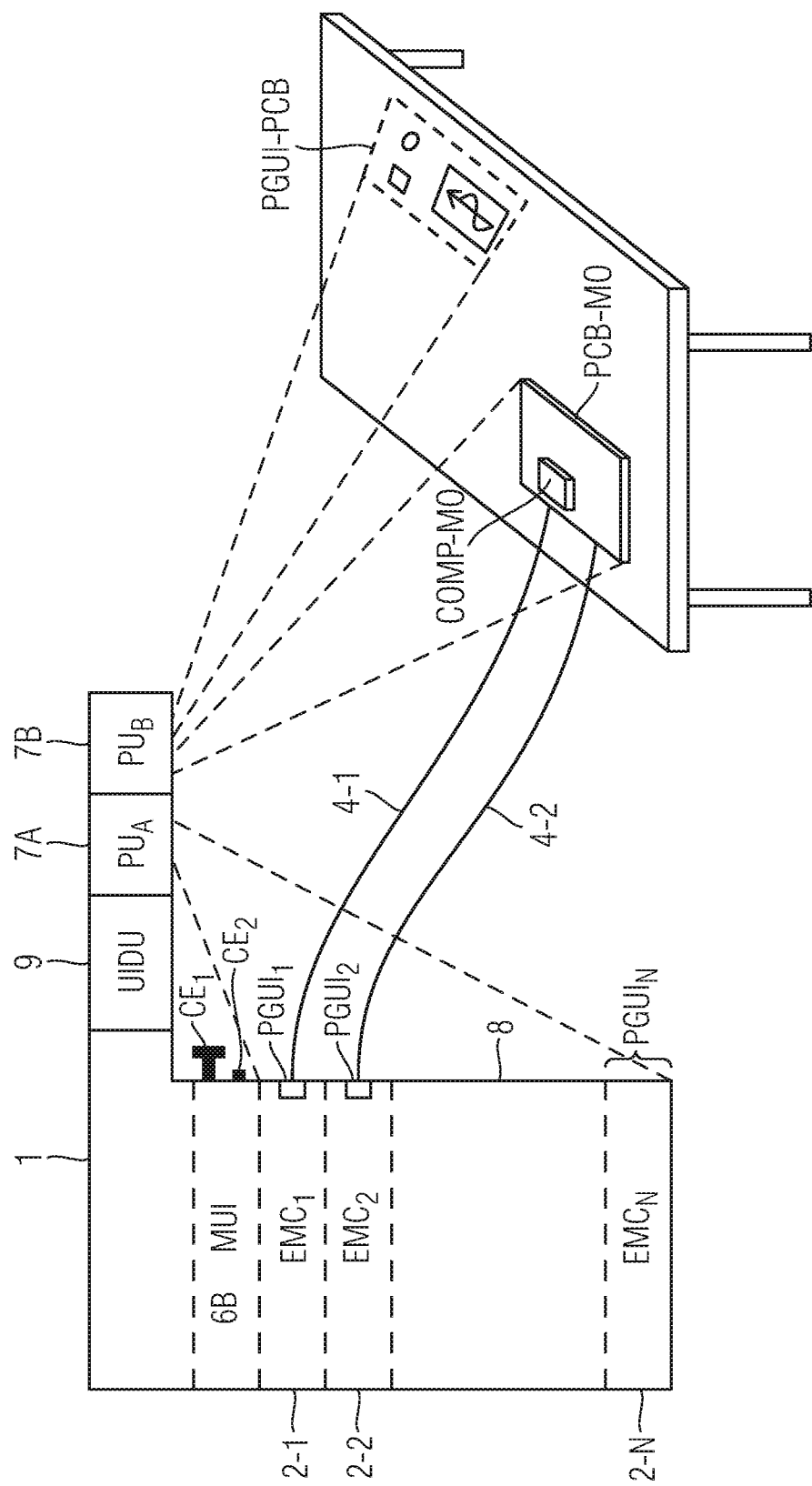
FIG. 3 shows a further schematic diagram for illustrating a possible exemplary embodiment of a measurement apparatus according to the present invention.

FIG. 3 shows a further possible exemplary embodiment of a measurement apparatus 1 according to the present invention. In the illustrated embodiment of FIG. 3, the measurement apparatus 1 does not only comprise a projected graphical user interface 6A but also a mechanical or physical user interface 6B. The mechanical user interface 6B comprises similar to conventional operation panels mechanical control elements CE1, CE2 such as knobs or control buttons. The control elements CE of the mechanical or physical user interface 6B can be used in a possible embodiment to configure and/or to adjust the projected graphical user interface 6A. For instance, a control element CE the physical user interface 6B can be used to adapt the size of a projected graphical user interface 6A projected by a projection unit on the front plate 8 of the measurement apparatus 1. The control elements CE of the physical user interface 6B can also be used for conventional user interactions with the measurement apparatus 1. In the illustrated exemplary embodiment of FIG. 3, the measurement apparatus 1 comprises more than one projection unit. In the illustrated embodiment, the measurement apparatus 1 comprises at least two projection units 7A, 7B. The first projection unit 7A is used to project one or several projected graphical user interfaces 6A on the front panel of the measurement apparatus 1. The first projection unit 7A can for instance be adapted to project several different projected graphical user interfaces 6A for the different internal electronic measurement circuits 2-$i$ integrated in a mounting rack of a measurement apparatus 1. In the illustrated embodiment of FIG. 3, the second projection unit 7B is adapted to project the adaptable graphical user interfaces as frontal projections on one or several projection areas including surfaces of one or several measurement objects MO located in the vicinity of the measurement apparatus 1 and/or on surfaces of the measurement surrounding. In the illustrated example, the second projection unit 7B can for instance project an adaptable graphical user interface 6A and/or enhancement information data on the surface of a measurement object MO formed by a printed circuit board PCB laid on a working table or working bench forming part of the measurement surrounding. In a possible embodiment, the second projection unit 7B can project relevant information describing components of the printed circuit board PCB visible to the user performing the measurement procedure. Further, the projection unit 7B can project graphical user interface elements directly on a surface of the measurement object MO such as the printed circuit board PCB. For instance, a user can press a projected button projected on the PCB and/or adjacent to the PCB on the working table. When the user presses the projected button, the user interface detection unit 9 can sense this optically and control the electronic measurement circuits 2-$i$ used for measuring the printed circuit board PCB as a measurement object accordingly. As is also illustrated in FIG. 3, the second projection unit 7B can also project a separate projected graphical user interface 6A for the printed circuit board PCB on a separate area of the working table. The projected graphical user interface 6A of the printed circuit board PCB or measurement object can comprise display elements and also projected control elements which can be used for interaction by the user. By displaying the projected graphical user interfaces 6A on external surfaces of the measurement surrounding, the size of the physical or mechanical user interface 6B of the measurement apparatus 1 can be minimized. Further, the measurement apparatus 1 is completely flexible to the different needs and the types of the measurement objects. The projected graphical user interface 6A can be configured individually for the respective measurement object and because measurement surrounding surfaces provide sufficient space for a complex projected graphical user interface 6A including a plurality of input or output elements. In a possible embodiment, different kinds of projected graphical user interfaces 6A for different components, subsystems, printed circuit boards PCB or complete devices under test DUT can be preconfigured and stored in a local memory of the measurement apparatus 1. In this embodiment, the mechanical or physical user interface 6B of the measurement apparatus 1 can be used to select a specific projected graphical user interface 6A from a plurality of preconfigured projected graphical user interfaces 6A stored in the local memory or in a remote database.

The size, form and pattern of the projected graphical user interface 6A can be adapted individually by the user for instance by using a control element of the physical user interface 6B. For instance, a user can change the size of the preconfigured projected graphical user interface projected on the working bench of the test environment.

Figure 4:
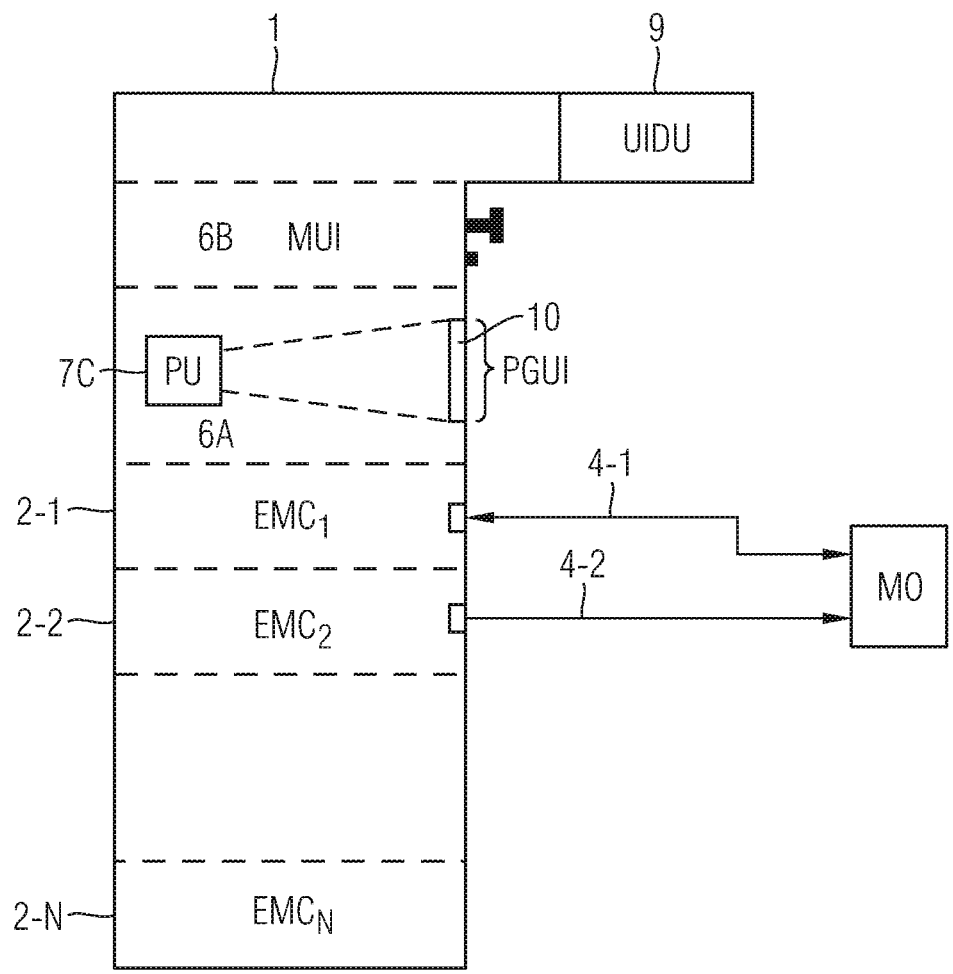
FIG. 4 shows a further schematic diagram for illustrating a possible exemplary embodiment of a measurement apparatus according to the present invention.

FIG. 4 shows a schematic diagram for illustrating a further possible embodiment of a measurement apparatus 1 according to the present invention. In the illustrated embodiment of FIG. 4, the adaptable graphical user interface 6A comprises a projection unit 7C integrated in the shielded housing of the measurement apparatus 1. In the illustrated embodiment of FIG. 4, the adaptable graphical user interface 6A is projected by the projection unit 7C as a rear projection on a projection area including a rear projection screen 10. In a possible embodiment, the rear projection screen 10 can comprise a diffusing screen.

Figure 5:
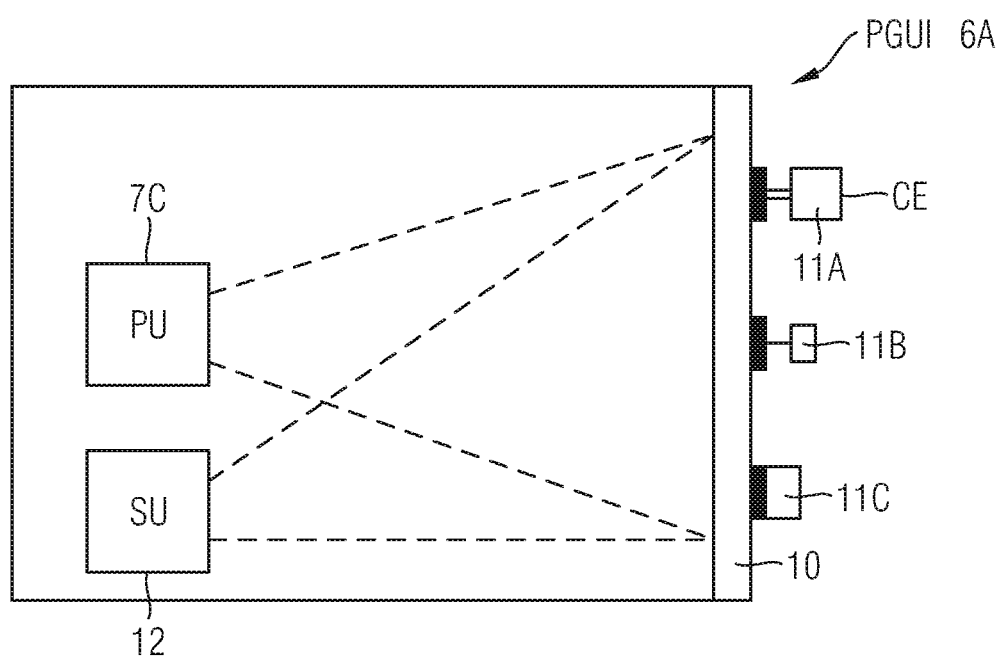
FIG. 5 shows a schematic diagram for illustrating a possible exemplary embodiment of a projected graphical user interface which can be used by a measurement apparatus according to the present invention.

FIG. 5 shows schematically a further possible exemplary embodiment of a projected graphical user interface 6A. In the illustrated embodiment, different physical control elements 11A, 11B, 11C can be attached to the rear projection screen 10 of the projected graphical user interface 6A of the measurement apparatus 1. The physical control elements can comprise knobs and/or buttons as illustrated in FIG. 5. The physical control elements can be applied individually according to the needs of the test and arrangement by the user on the rear projection screen 10. The mechanical control elements 11A, 11B, 11C can be attached temporarily to the rear projection screen 10, for instance by magnets, suction cups and/or removable glue. In a possible embodiment, the mechanical control elements 11A, 11B, 11C can comprise reflection means adapted to change a reflection of a light beam projected by the projection unit 7C on the rear projection screen 10 upon actuation of the mechanical control element 11 by the user. For instance, if a user turns the control element knob 11A illustrated in FIG. 5, a reflection surface on the base of the control element 11A can change its reflection characteristics so that a light beam reflected by the rear reflection screen 10 is influenced in response to the user action. A change of the light reflection can be detected in a possible embodiment by a sensor element or sensor unit 12 as illustrated in the embodiment of FIG. 5.

Figure 6:
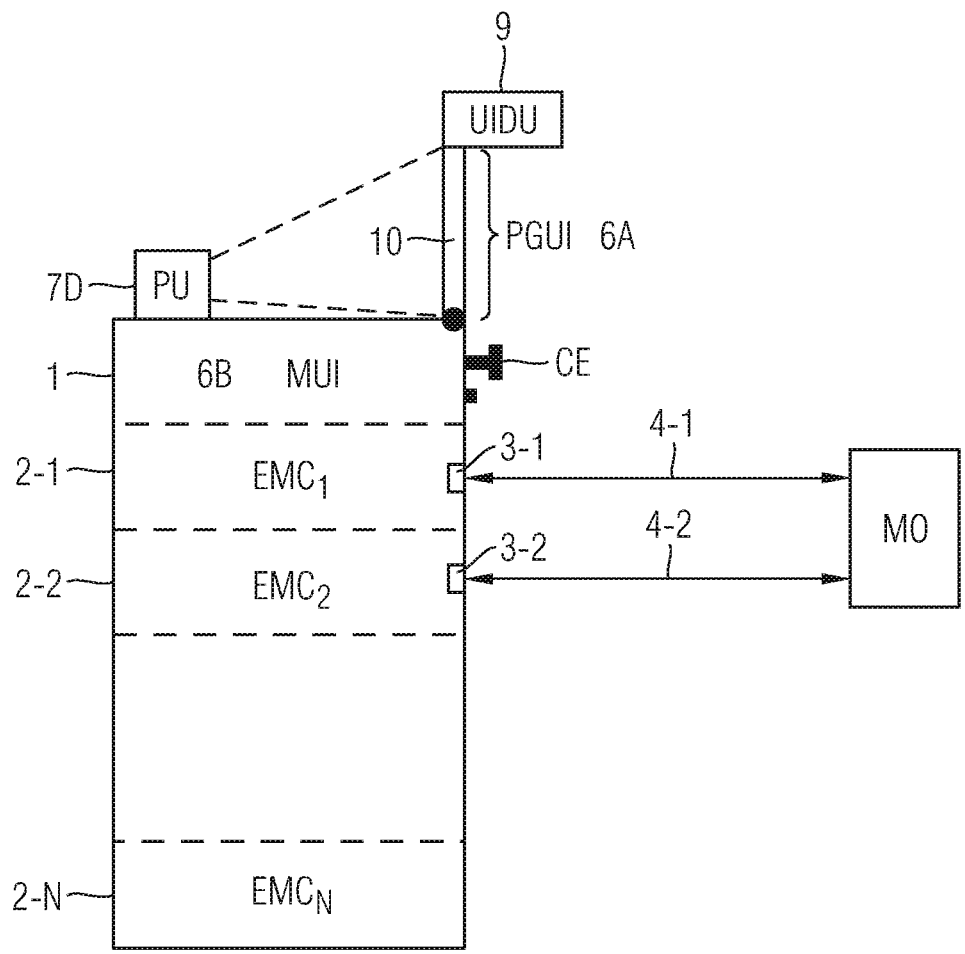
FIG. 6 shows a further schematic diagram of a possible exemplary embodiment of a measurement apparatus according to the present invention.

FIG. 6 shows a schematic diagram for illustrating a further possible exemplary embodiment of a measurement apparatus 1 according to the present invention. In the illustrated embodiment, the measurement apparatus 1 comprises a rear projection screen 10 adapted to provide a projected graphical user interface 6A of the measurement apparatus 1. In the illustrated embodiment, the rear projection screen 10 is a screen mounted to the housing of the measurement apparatus 1. Further, in the illustrated embodiment, the projection unit 7D is attached to the housing of the apparatus 1 and projects a graphical user interface 6A on the rear projection screen 10 as shown in FIG. 6. In a possible embodiment, the rear projection screen 10 is pivotable around an axis and can be moved by a user into a suitable position for receiving the projections from the projection unit 7D. In the illustrated embodiment, the measurement apparatus 1 further comprises a conventional mechanical user interface 6B with control elements which can be used for configuration and adjusting functions of the projected graphical user interface 6A. A user interaction detection unit 9 is adapted to detect user interactions with the projected graphical user interface 6A.

Figure 7:
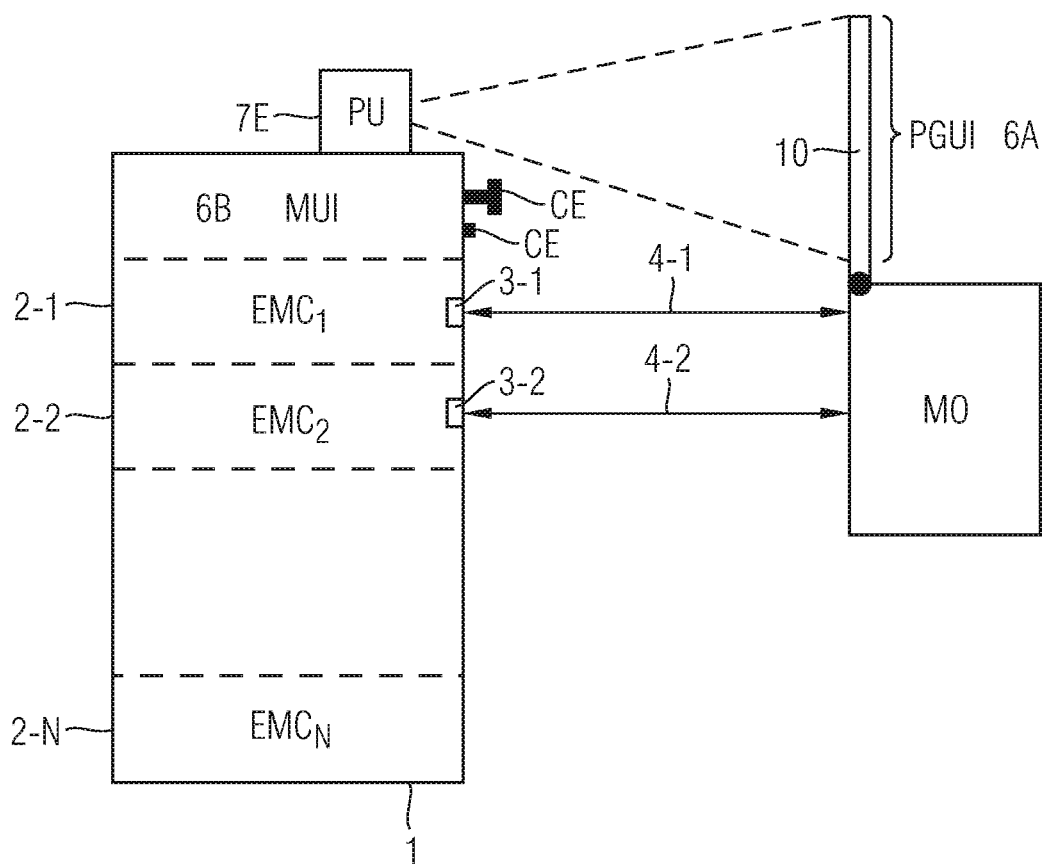
FIG. 7 shows a further schematic diagram of a further possible exemplary embodiment of a measurement apparatus according to the present invention.

FIG. 7 shows a further schematic diagram for illustrating a possible embodiment of the measurement apparatus 1 according to the present invention. In the illustrated embodiment of FIG. 7, the rear projection screen 10 does not form part of the measurement apparatus 1 but is connected to the housing of the measurement object MO. In the illustrated embodiment, the measurement object MO such as a device under test comprises a rear projection screen 10 which can be pivoted on the axis to face the projection unit 7E of the measurement apparatus 1 and to provide the projected graphical user interface 6A during measurement of the device under test. After the measurement and testing has been completed, the rear projection screen 10 can be rotated around the axis in clockwise direction to abut the housing of the device under test.

In the embodiment illustrated in FIG. 6, the rear projection screen 10 is pivotably linked to the housing of the measurement apparatus 1. In the embodiment illustrated in FIG. 7, the rear projection screen is attached to the housing of the measurement object MO. In a still further possible embodiment, the rear projection screen can be fixed or mounted to the measurement apparatus 1 and/or to the measurement object MO. In a possible embodiment, multiple different rear projections screens can be prepared or preconfigured for different measurement tasks. A user can choose or pick a suitable rear projection screen 10 suitable for the current measurement task and mount it to the measurement apparatus 1 as illustrated in FIG. 6 or to the measurement object MO as illustrated in FIG. 7. The preconfigured rear projection screen 10 used as a projection area can be exchanged by the user for different measurement purposes. In a possible embodiment, the preconfigured rear projection screen 10 can comprise at least one integrated screen marker which can be used to detect a type and/or a configuration of the respective rear projection screen 10 mounted by the user to the measurement apparatus 1 or to the measurement object MO. This screen marker can be detected by a separate screen detection unit of the measurement apparatus 1. By exchanging rapidly the different preconfigured rear projections screens for different measurement tasks, the required testing time can be reduced significantly. The display area of the projected graphical user interface 6A can cover in a possible embodiment multiple units, in particular devices under test. It can reach over several front plates 8 of electronic measurement circuits 2-$i$ mounted side by side in the rack of the measurement apparatus 1. The displayed area of the projected graphical user interface 6A can also cover different areas or surfaces of one or several measurement objects MO or surfaces of the measurement environment.

As becomes evident from the above exemplary embodiments, there is a huge variety of possible variants of the measurement apparatus 1 having one or several projected graphical user interfaces 6A. The measurement apparatus 1 having means for providing the projected graphical user interface 6A can be adapted flexibly to a wide range of use cases including different kinds of test procedures, measurement procedures and can be adapted to a huge variety of different kinds of measurement objects individually. Because of this high degree of flexibility of the projected graphical user interface 6A, the required area or space for the user interface can be minimized thus reducing also the size of the measurement apparatus 1 itself. By reducing the required size of the electronic measurement apparatus 1, also the quality of the measurement results can be improved since in specific measurement applications at very high frequencies Gigahertz range, the measurement results are improved when the measurement apparatus 1 is small and can be placed very close to the measurement object MO. Further, by reducing the required space for the user interface, the number of measurement objects MO which can be connected simultaneously to the respective measurement apparatus 1 can be increased. Consequently, a higher number of measurement objects MO can be tested in parallel by a measurement apparatus 1 requiring less space for a user interface. Further, the projected graphical user interface 6A allows for a quick change of the measurement setup in case that the measurement object MO itself has been changed.

What I claim is:

1. A measurement apparatus, comprising:
at least one shielded electronic measurement circuit configured to measure and process high frequency electrical signals with a frequency of more than 1 GHZ,
wherein the measurement apparatus comprises a housing adapted to provide radio frequency (RF) shielding of the at least one shielded electronic measurement circuit processing the high-frequency electrical signals, wherein each of the shielded electronic measurement circuits comprises a measurement interface to connect one or several measurement objects (MO) via measurement cables, and
a user interface used by a user to interact with the shielded electronic measurement circuits of said measurement apparatus,
wherein the user interface comprises at least one adaptable graphical user interface projected by a projection unit of said measurement apparatus on one or several projection areas,
wherein the one or several projection areas are the surfaces of the one or several measurement objects (MO),
wherein the adaptable graphical user interface projected by said projection unit of said measurement apparatus is changed automatically by a controller of said measurement apparatus depending on an internal operation state of the one or several measurement objects (MO) connected to the measurement interface and measured by said measurement apparatus, and
wherein the user interface of said measurement apparatus further comprises a physical user interface with mechanical control elements manually operated by a user to configure or to adjust the projected graphical user interface.

2. The measurement apparatus of claim 1,
wherein the at least one adaptable graphical user interface is a first graphical user interface and the projection unit is a first projection unit, the measurement apparatus further comprising a second projection unit, which projects a second adaptable graphical user interface, and
wherein the second adaptable graphical user interface is projected by said second projection unit as a frontal projection on one or several projection areas including projection panels or housing plates of said measurement apparatus on surfaces of the measurement surrounding.

3. The measurement apparatus of claim 1, wherein the measurement objects (MO) comprise at least one of: electronic components located on a circuit board, workpieces or devices under test (DUT) measured by said measurement apparatus.

4. The measurement apparatus of claim 1,
wherein the at least one adaptable graphical user interface is a first graphical user interface and the projection unit is a first projection unit, the measurement apparatus further comprising a second projection unit, which projects a second adaptable graphical user interface, and
wherein the second adaptable graphical user interface is projected by said second projection unit as a rear projection on one or more projection areas including rear projection screens of said measurement apparatus.

5. The measurement apparatus of claim 1, further comprising at least one user interaction detection unit adapted to detect an interaction of the user with the projected graphical user interface.

6. The measurement apparatus of claim 1, further comprising at least one user interaction detection unit adapted to detect a change of the projection area caused by the user or caused by an external physical object.

7. The measurement apparatus of claim 1, wherein the projection unit of said measurement apparatus comprises at least one laser projector.

8. The measurement apparatus of claim 1, wherein the adaptable graphical user interface projected by said projection unit of said measurement apparatus is changed automatically by a controller of said measurement apparatus depending on output signals of the one or several measurement objects (MO) connected to the measurement interface and measured by said measurement apparatus.

9. The measurement apparatus of claim 4, wherein one or more mechanical control elements are attached temporarily to a rear projection screen of said measurement apparatus by magnets, suction cups or removable glue.

10. The measurement apparatus of claim 9, wherein the mechanical control elements attached to the rear projection screen comprise reflection means adapted to change a reflection of light projected on said rear projection screen by said projection unit upon actuation of the respective mechanical control elements by a user detected by a sensor unit of said measurement apparatus.

11. The measurement apparatus of claim 4, wherein different rear projection screens used as projection areas for the graphical user interface of said measurement apparatus are preconfigured and are exchangeable by a user for different measurement arrangements or measurement purposes.

12. The measurement apparatus of claim 1, wherein a preconfigured rear projection screen comprises at least one screen marker used to detect a type or a configuration of the rear projection screen mounted by a user to the measurement apparatus by a screen detection unit of said measurement apparatus.

* * * * *